United States Patent
Guenther et al.

(10) Patent No.: US 7,769,577 B2
(45) Date of Patent: *Aug. 3, 2010

(54) HARDWARE ACCELERATOR WITH A SINGLE PARTITION FOR LATCHES AND COMBINATIONAL LOGIC

(75) Inventors: Gernot E. Guenther, Endicott, NY (US); Viktor Gyuris, Wappingers Falls, NY (US); Harrell Hoffman, Austin, TX (US); Kevin Anthony Pasnik, Westford, VT (US); John Henry Westerman, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 375 days.

This patent is subject to a terminal disclaimer.

(21) Appl. No.: 11/848,489

(22) Filed: Aug. 31, 2007

(65) Prior Publication Data

US 2007/0294071 A1 Dec. 20, 2007

Related U.S. Application Data

(63) Continuation of application No. 11/064,727, filed on Feb. 24, 2005, now Pat. No. 7,290,228.

(51) Int. Cl.
*G06F 17/50* (2006.01)
*G06F 9/45* (2006.01)
(52) U.S. Cl. .............................. 703/13; 703/14; 703/15; 703/16; 703/19; 703/21; 716/1; 716/4; 716/6
(58) Field of Classification Search ............. 703/14–16, 703/19, 21; 716/1, 4, 6, 7
See application file for complete search history.

(56) References Cited

U.S. PATENT DOCUMENTS

| 5,649,176 | A  | * | 7/1997  | Selvidge et al. ............. 713/400 |
| 5,726,918 | A  | * | 3/1998  | Giramma et al. .............. 703/14 |
| 5,937,179 | A  | * | 8/1999  | Swoboda ..................... 716/16 |
| 6,009,531 | A  | * | 12/1999 | Selvidge et al. ............. 713/400 |
| 6,026,230 | A  | * | 2/2000  | Lin et al. ..................... 703/13 |
| 7,089,518 | B2 | * | 8/2006  | Bair et al. ..................... 716/6 |
| 7,257,524 | B2 | * | 8/2007  | Schilp et al. .................. 703/14 |
| 7,290,228 | B2 | * | 10/2007 | Guenther et al. ............... 716/4 |
| 2002/0143515 | A1 | * | 10/2002 | Nadeau-Dostie et al. ...... 703/19 |
| 2003/0171908 | A1 | * | 9/2003  | Schilp et al. .................. 703/16 |
| 2004/0153302 | A1 |   | 8/2004  | Mukund et al. |

(Continued)

*Primary Examiner*—Kamini S Shah
*Assistant Examiner*—Kibrom Gebresilassie
(74) *Attorney, Agent, or Firm*—Martin & Associates, LLC; Bret J. Petersen

(57) ABSTRACT

A hardware accelerator includes hardware support for a combinational only cycle and a latch only cycle in a simulation model with a single partition of latches and combinational logic. Preferred embodiments use a special 4-input 1-output function unit in the hardware accelerator in place of the normal latch function that write back the old latch value for combinational only cycles. Other embodiments include hardware support for separate array write disables for arrays and transparent latches depending on whether the cycle is a combinational only cycle and a latch only cycle. A conditional array write disable dependent on the occurrence of a hardware breakpoint is also included that supports switching from a latch plus combinational cycle to a latch only cycle, to give control to the user before evaluating the combinational logic if a breakpoint occurs on a latch.

10 Claims, 4 Drawing Sheets

U.S. PATENT DOCUMENTS

2004/0236556 A1* 11/2004 Lin .............................. 703/14
2005/0198606 A1* 9/2005 Gupta et al. .................. 716/18
2005/0228630 A1* 10/2005 Tseng et al. .................. 703/19
2005/0251773 A1* 11/2005 Bair et al. ...................... 716/6
2006/0232296 A1* 10/2006 Wang et al. ................... 326/40

* cited by examiner

HARDWARE ACCELERATOR WITH A SINGLE PARTITION FOR LATCHES AND COMBINATIONAL LOGIC

CROSS-REFERENCE TO PARENT APPLICATION

This patent application is a continuation of Ser. No. 11/064,727 filed Feb. 24, 2005, now U.S. Pat. No. 7,290,228 which is incorporated herein by reference.

BACKGROUND OF THE INVENTION

1. Technical Field

This invention generally relates to systems modeling and development, and more specifically relates to hardware simulators with a hardware accelerator.

2. Background Art

Today's integrated circuit (IC) systems are often a highly complex combination of hardware and software that must function within very specific constraints in order for the computer system to operate as designed. Computer aided design tools allow IC designers to model a new design and to model how the new design will interact with and respond to existing systems or components prior to production. Modeling with computer aided design tools can significantly accelerate the design process and reduce the time to market for IC systems, which can be a competitive advantage. This modeling is typically accomplished by using simulation systems that model hardware function and performance in software, hardware-accelerated software simulation systems, or hardware emulation systems that use a combination of software and hardware to model a circuit or system design.

Simulation has long been a preferred method for verification of logical correctness of complex electronic circuit designs. Simulation is broadly defined as the creation of a model which, if subjected to arbitrary stimuli, responds in a similar way to the manufactured and tested design. More specifically, the term "simulation" is typically used when such a model is implemented as a computer program. In contrast, the term "emulation" is the creation of a model using programmable (also known as reconfigurable) logic or field-programmable gate array (FPGA) devices. Simulation/Emulation saves a significant amount of time and financial resources because it enables designers to detect design errors before the expensive manufacturing process is undertaken. Moreover, the design process itself can be viewed as a sequence of steps where the initial general concept of a new product is being turned into a detailed blueprint. Detecting errors at the early stages of this process also saves time and engineering resources. The primary advantage of emulation over simulation is speed. However emulation typically lacks access to internal nodes needed for detailed analysis. Simulation acceleration uses special a purpose hardware accelerator to speed up the model evaluation. Simulation acceleration has the advantages of software simulation and increased speed.

The typical IC design process describes the IC logic in Very high speed IC Hardware Description Language (VHDL) or some other type of hardware description language, feeds VHDL into a simulation environment, and loads a netlist which describes the interconnection topology of the design into a hardware accelerator. The hardware accelerator typically is a chassis full of software programmable logic such as an array of multiplexers. Software evaluates the netlist and partitions it so that the programmable logic can be programmed to simulate the topology of the proposed design. The designer then interacts with the hardware accelerator to simulate and evaluate the operation of the proposed IC design.

Referring now to FIG. 1, a typical simulation environment 100 includes a workstation 110, and a hardware accelerator 120. A communication link 130 provides an intercommunication link between the work station and the hardware accelerator 120. In this prior art simulation system 100, the simulation model 140 in the hardware accelerator 120 has separate partitions for latches 150 and combinational logic 160. Workstation 110 may be any type of microprocessor-based computer or computer system known to those skilled in the art. Hardware accelerator 120 is a large-scale hardware configuration implemented with programmable logic such as multiplexer arrays or some other type of custom hardware. Some hardware accelerators 120 include a function unit array 170. This system is capable of using the function unit array 170 to emulate many different types of computer system hardware components including, for example, combinational logic, latches and memory devices.

FIG. 2 shows another simulation system believed to be in the prior art. This simulation environment 200 includes a workstation 110, and a hardware accelerator 120. A communication link 130 provides an intercommunication link between the work station and the hardware accelerator 120. In this prior art simulation system 200 the hardware accelerator 120 has a simulation model 140 that has a single partition 210 for latches and combinational logic. The hardware accelerator 110 includes a function unit array 170 as described above with reference to FIG. 1. This system relies on virtual logic to provide the benefits of a latch only cycle and a combinational only cycle, which decreases system performance.

In an IC design, there are memory elements such as latches and arrays, and combinatorial logic elements such as "AND" and "OR" gates. In a simple design, the output values from the latches propagate through the combinational logic. The output of the combinational logic becomes the input of the latches that are updated on the next "clock". A simulation cycle would consist of the following sequence:

latches→combinational logic—(clock)→latches

During simulation, developers want to look at the values of both latches and combinational logic, and the general expectation is that the values of the combinational logic correspond to the output of the latches, i.e. the state of the design before the "clock". If developers were to only read signals, the simulator would only have to stop the simulator after the combinational logic. A simulation cycle would consist of the following sequence:

"user control (read, clock)"→"update latches"→"update combinational"→"user control".

However, developers also have the option of changing or sticking the values of latches and signals when the simulation is continued after a user control stop. If the developer changes a latch or signal and then issues a "clock" command, the expectation is that the latches will be updated based on the changes that the user made. Therefore, in this case, a simulation cycle would consist of the following sequence:

"user control (read/alter/stick, clock)"→"update combinational"→"update latches"→"update combinational"→"user control".

In the last example, the combinational logic is evaluated twice (before and after the user control). The combinational logic is updated before the user control so that the developer would have access to the updated signal values. The update combinational after user control can be deferred and only done on user control cycles when the user actually alters signals.

In more complex designs, there can be memory elements within the combinational logic such as transparent latches. Transparent latches act like latches in that they can retain their previous cycle's value, but they act like combinational logic in that their output is updated right away, without waiting for a clock. Because of these memory elements, there may be a feedback loop within the combinational logic such that the output will be different after updating the combinational logic several times. Depending on the runtime environment, the simulator may be able to avoid ever having to update the combinational logic more than once, or this feedback behavior may be accepted/expected by the users.

In some prior art simulators like the Awan simulator developed by IBM, the model contains two separate partitions (a combinational partition followed by a latch partition). The functions of update latches and update combinational are achieved by setting the simulator's start and end address to the partition's start and end address. So to clock a large number of cycles at a time, the start and end address would be set so that both partitions are run, and the simulation would stop after evaluating the latch partition. This made it simple to avoid multiple combinational logic evaluations as described above.

In some simulators, including those that employ more parallelism to increase speed, there are no separate partitions for latches and combinational logic. Within the model, the latches are placed before the combinational logic that they feed, so that one or more full cycles would end after evaluating the combinational logic. Whenever the simulator needs to update either the latches or the combinational logic, both are actually evaluated. So the simulator cannot perform an update latches and an update combinational by running the separate models in the separate partitions for latches and combinational logic.

DISCLOSURE OF INVENTION

Given the limitations associated with existing systems as described above, there is a need to provide a simulation system with a latch only and combinational only cycle as follows:

combinational only: while running through both latches and combinational logic, prevent updates to the latch memory elements (latches and read before write arrays); and latch only: while running through both latches and combinational logic, prevent updates to the combinational logic memory elements (transparent latches and write before read arrays).

According to the preferred embodiments, a simulator system with a hardware accelerator is disclosed that has hardware support for a combinational only cycle and a latch only cycle in a simulation model with a single partition of latches and combinational logic. Preferred embodiments use a special function multiplexer in combination with the function unit in the hardware accelerator to write back the old latch value for combinational only cycles. This system should allow for simulation and emulation to take place at greater speeds and with increased flexibility.

Other embodiments include hardware support for separate array write disables for arrays depending on whether the cycle is a combinational only cycle or a latch only cycle. A conditional array write disable dependent on the occurrence of a hardware breakpoint is also included. This allows to switch from a latch+combinational cycle to a latch only cycle, to give control to the user before evaluating the combinational logic if a breakpoint occurs on a latch. In addition to disabling the arrays, embodiments also prevent updates to any transparent latches.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

The present invention relates to a hardware accelerator for a hardware simulation system. Simulation systems have been used for many years to model hardware systems or components in software. Hardware emulation is a technology related to simulation which is used to model a hardware design. A simulator with an accelerator typically includes a host computer (such as a workstation) that communicates with the accelerator. An accelerator typically includes one or more arrays of programmable hardware such as multiplexers, which may be programmed to represent the hardware function or functions necessary to implement the concurrent model.

Figure 1:
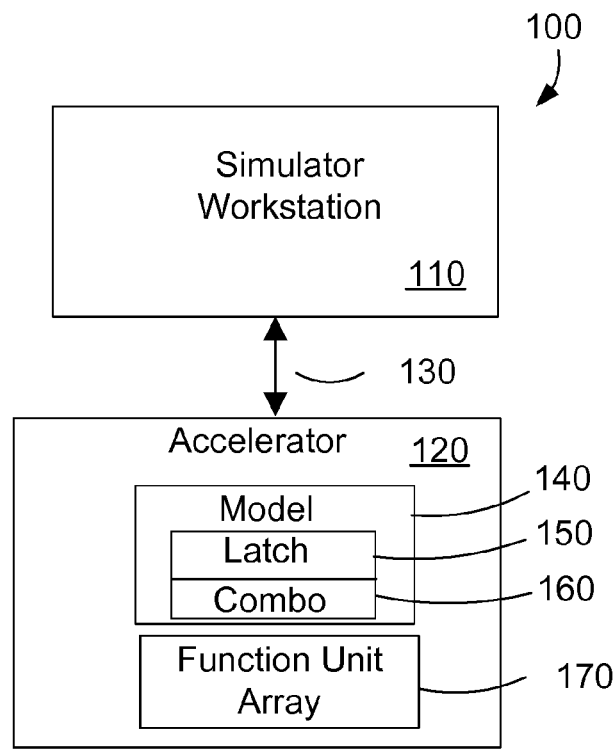
FIG. 1 is a block diagram of a typical workstation-based simulation environment where the latch and combinational are stored in separate partitions in the simulator model.
Figure 2:
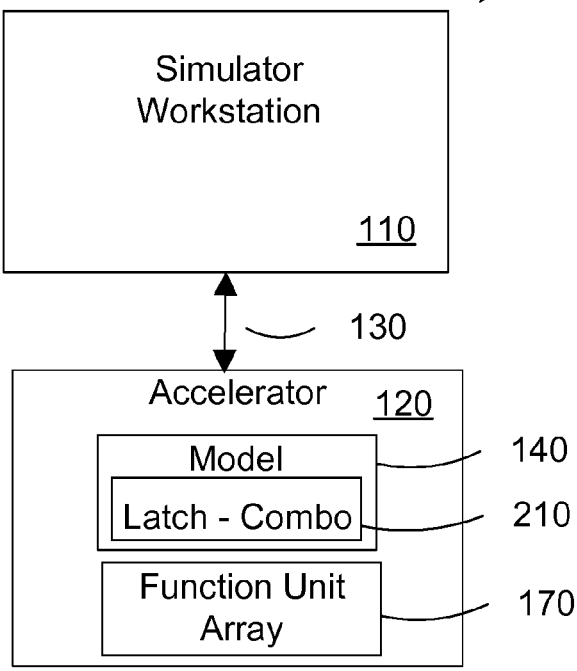
FIG. 2 is a block diagram of a typical workstation-based simulation environment where the latch and combinational are stored in a single partition in the simulator model.
Figure 3:
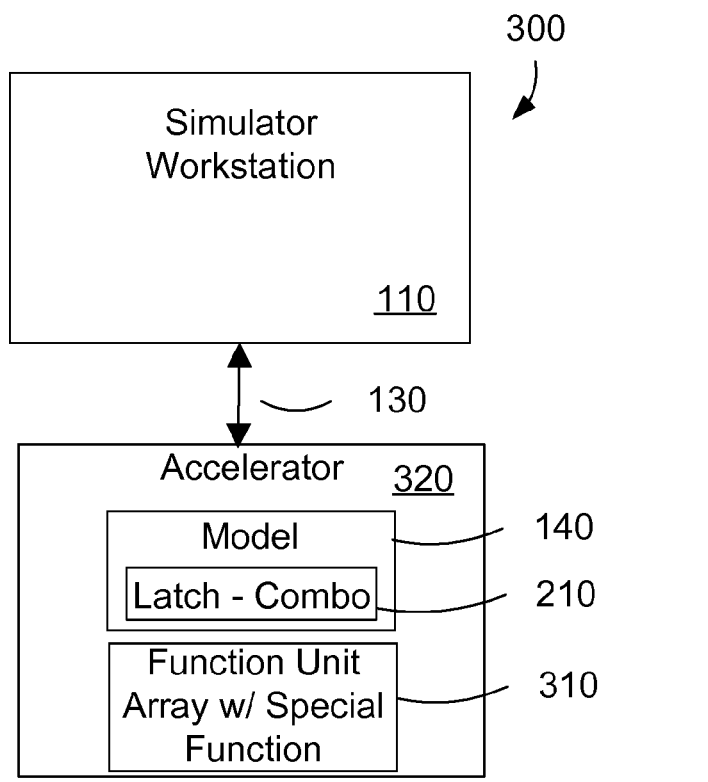
FIG. 3 is a block diagram of a workstation-based simulation environment where the latch and combinational are stored in a single partition in the simulator model according to preferred embodiments.

In accordance with an embodiment herein, a system for providing hardware acceleration in a simulation environment is provided with reference to FIG. 3. The simulation system 300 includes a simulator workstation 110, and a hardware accelerator 320. A communication link 130 provides an intercommunication link between the work station and the hardware accelerator 320. The simulation model 140 in the hardware accelerator 320 has a single partition 210 for latches and combinational logic. Hardware accelerator 320 includes a function unit array 310 with a special function selection circuit for each function unit. The special function selection circuit may be implemented with a multiplexer as described below. The function unit array 310 is capable of emulating different types of hardware components including combinational logic and latches. Further the function unit array 310 with the special function selection circuit allows the simulator system 300 to implement a latch only cycle and a combinational only cycle as described further below.

Figure 4:
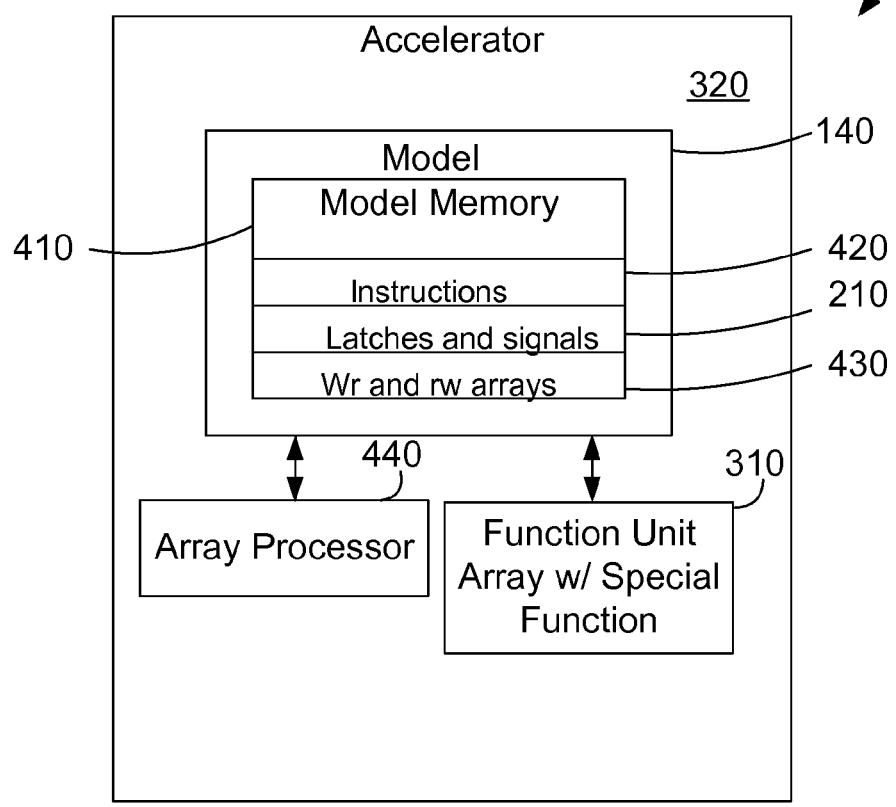
FIG. 4 is a block diagram of a hardware accelerator according to a preferred embodiment.

FIG. 4 shows more detail of the simulation model in the hardware accelerator described above in reference to FIG. 3. The simulation model 140 includes a model memory 410. The model memory includes memory for instructions 420 for the accelerator model, memory for the write before read arrays (wr-arrays) and the read before write arrays (rw-arrays) 430, in addition to the memory for the latches and signals 210 described above. In the preferred embodiments herein, the model memory 410 containing the values of all latches and signals is always written whenever the function is evaluated because there is a single partition for latches and logic. In a combinational only cycle, it is desirable to prevent updates to latches, even though all the data memory of the model is being updated. The special function selection circuit allows the latch to retain its previous value even though the memory is being updated. The array processor 440 processes the arrays 430 according to the instructions in the instruction memory 420 and described further below.

Figure 5:
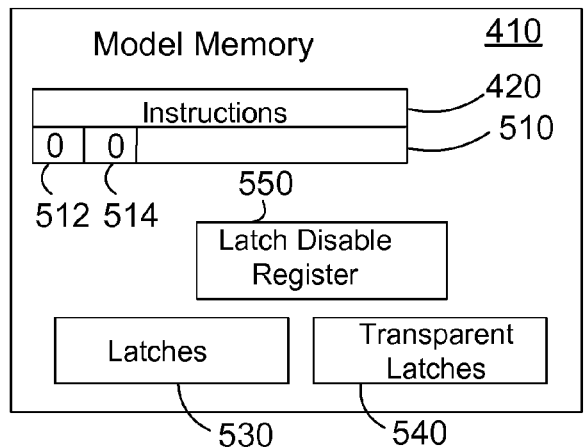
FIG. 5 is a block diagram of the model memory of a hardware accelerator having hardware support to disable latches and transparent latches according to a preferred embodiment.

FIG. 5 shows the hardware support to disable transparent latches and latches according to preferred embodiments. The model memory 410 includes an instructions memory area 420 as described above. The instructions memory area 420 includes one or more bits 510 that indicate, when asserted, whether a particular instruction belongs to a latch or a transparent latch. In the illustrated embodiment, a first bit 512 is used to indicate the instruction is a latch and a second bit 514 is used to indicate a transparent latch. The model memory 410 includes a latch disable register 550 that has bits to disable latches and transparent latches. In the preferred embodiments, the latch disable register 550 has a bit to disable latches and a bit to disable transparent latches for a normal instruction, and additional bits to disable latches and transparent latches on a breakpoint. The latch disable register 550 could also be outside the model memory and reside elsewhere in the hardware accelerator. The latch disable register 550 is used to disable latches 530 and transparent latches 540 by selecting the special function described with reference to FIG. 6 below.

Figure 6:
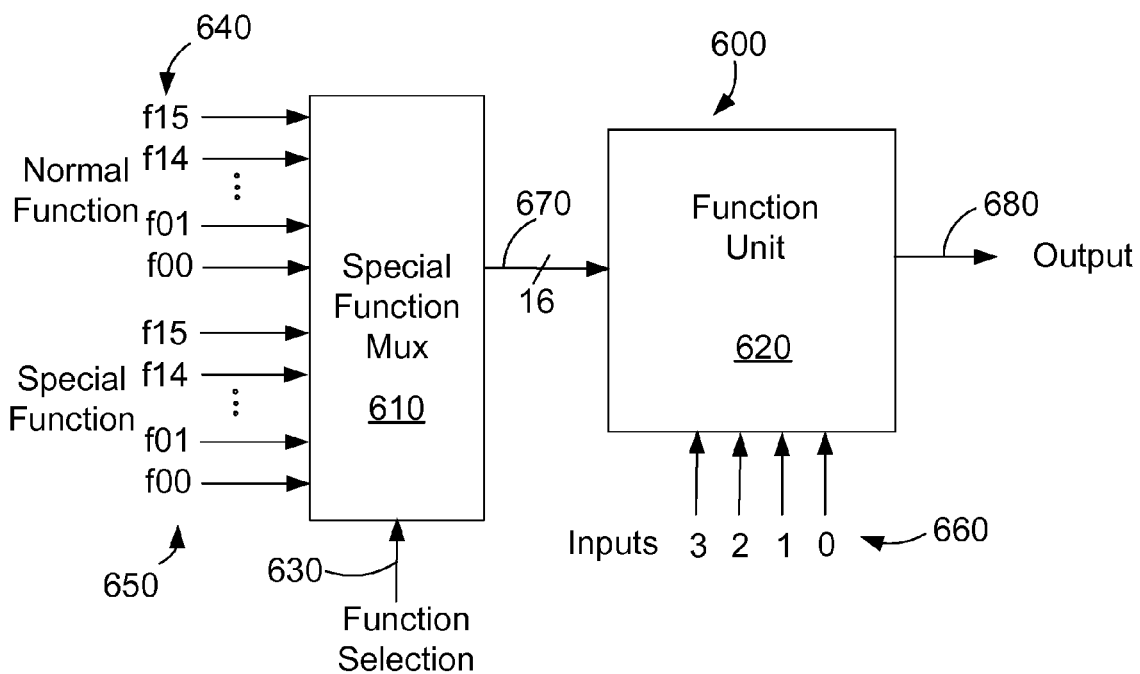
FIG. 6 is a block diagram of a function unit with a special function multiplexer circuit according to a preferred embodiment.

Latches and combinational logic in the model 140 are implemented in the hardware accelerator 320 using a functional unit array 310 (shown in FIG. 4). FIG. 6 shows more detail of one element 600 of the functional unit array 310 with a special function selection circuit implemented with a special function multiplexer 610 according to the preferred embodiments. Each function unit 620 is preceded by a special function multiplexer 610 to select the inputs to the function unit 620. The special function multiplexer 610 has a function selection 630 that selects either the normal function 640 or the special function 650. The normal function 640 comes from the instruction memory 420 as is typical for this type of hardware accelerator. The special function 650 comes from a special function register described below. In the preferred embodiment, the function selection has the value of (is_latch and disable_latches) OR (is_transparent_latch and disable_transparent_latches).

Again referring to FIG. 6, the function unit 620 is a function unit as used in the prior art, and is typically a 16 input one output multiplexer. Four binary select inputs 660 select which data on the function inputs 670 to place on the output 680 of the function unit 620. The function unit inputs 670 come from the special function multiplexer 610 and the binary selects inputs 660 are driven with data from the model memory 410. The function unit 620 in the combinational only cycle will always write back the old latch value when the function selection 630 selects the special function to apply to the function unit inputs 670. The special function multiplexer (mux) 610 selects the special function 650 when the model instructions 420 indicate that the current instruction is a latch instruction and the disable latches bit 512 is set in the latch disable register 550. When the special function 650 is applied to the function unit 620, the output 680 will reflect the value of the special function selected by the input bits 660. As described further below, the value of the special function is such that the output 680 will be the same as the value on bit 3 of the input 660. This feature of the special function 650 in combination with the function unit 620 allows an output 680 to be stored with the same value as the previous instruction of the simulation model because all transparent latches and latches have an input that is a feedback. The compiler that compiles the simulation model 140 supplies the feedback to input 3 in order to make a single value of the special function 650 possible. The special function is chosen such that the value of input 3 is reflected to the output 680.

Figure 7:
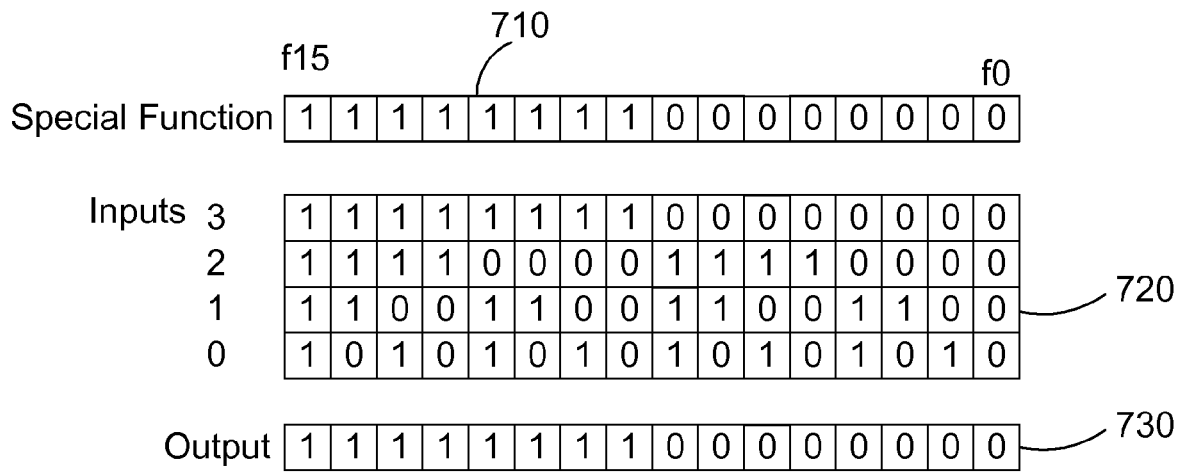
FIG. 7 is a list of the data applied to the special function multiplexer in FIG. 5.

FIG. 7 shows the contents of the special function 710 that is input to the special function mux (610 in FIG. 6) to retain the previous latch value for a combinational only cycle. The values of the data in the special function 710 can be supplied by a special function register (not shown) in the hardware accelerator 320. The inputs block 720 shows the truth table for all possible input combinations of the function unit 660, and the output 730 reflects the value that would be the output 680 for the function unit with the corresponding inputs in the truth table 720. It can be seen in FIG. 7 that the output data will always be the same as the value on input 3. The special function can prevent updates to latches and transparent latches for the combinational only cycle because when the data written to memory is used as an input 660 for the next cycle the output will be the same as the input on input 3.

Again referring to FIG. 5 another embodiment provides a conditional latch disable that is dependent on the occurrence of a hardware breakpoint. This allows simulation to switch from a latch+combinational cycle to a latch only cycle, to give control to the user before evaluating the combinational logic if a breakpoint occurs on a latch. (If in the models the combinational logic precedes the latches, the simulation can be stopped before evaluating the latches if a breakpoint is hit in the combinational logic.) In order to implement the latch disable, the latch disable register 550 contains a bit to disable latches for a break point and a bit to disable transparent latches for a break point. While evaluating instructions after a breakpoint is encountered, the array processor 440 will look at the instruction memory bits 510 to determine the type of latch and at the disable status register 550 to determine if the latch type is to be updated for a breakpoint. If the latch disable register 550 indicates the corresponding array is not to be updated for the current breakpoint cycle then the array processor will not update the corresponding latch using the mechanism described above with reference to FIG. 6.

Figure 8:
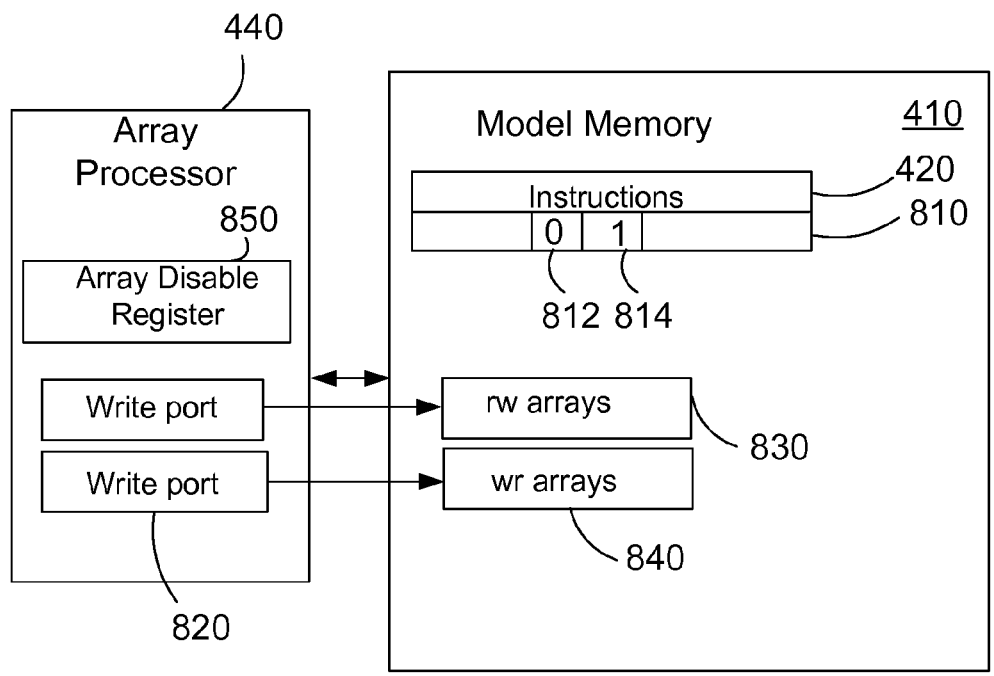
FIG. 8 is a block diagram of a preferred embodiment of the hardware accelerator having hardware support for disabling wr-arrays and rw-arrays.

FIG. 8 illustrates another embodiment that includes hardware support for array write disables. FIG. 8 shows the hardware support for an array write disable for wr-arrays and rw-arrays. The model memory 410 includes an instructions memory area 420 as described above. The instructions memory area 420 includes one or more bits 810 that when asserted indicate whether a particular write port 820 belongs to a rw-array 830 or a wr-array 840. A preferred embodiment has two bits for each write port 820. In the illustrated embodiment shown in FIG. 8, the first bit 812 in the instructions memory 420 is a zero to indicate the array associated with the write port is not a rw-array 840. The second bit 814 in the instructions memory 420 is a one to indicate the array associated with the write port is a wr-array 830. Further, the array processor 440 includes an array disable register 850 that has a bit to disable rw-arrays and a bit to disable wr-arrays. The array disable register 850 indicates whether or not to update these arrays. During the simulation, when a write port is encountered by the hardware accelerator 320, the array processor 440 will look at the instruction memory bits 810 to determine the type of array. The one bits indicate whether the array is a wr-array or rw-array. If the array disable register 850 indicates the corresponding array is not to be updated for the current cycle then the array processor will not update the array.

Again referring to FIG. 8 another embodiment provides a conditional array write disable that is dependent on the occurrence of a hardware breakpoint. This allows simulation to switch from a latch+combinational cycle to a latch only cycle, to give control to the user before evaluating the combinational logic if a breakpoint occurs on a latch. (If in the models the combinational logic precedes the latches, the simulation can be stopped before evaluating the latches if a breakpoint is hit in the combinational logic.) In order to implement the array disable, the array disable register 850 contains a bit to disable rw-arrays for a break point and a bit to disable wr-arrays for a break point. So at a breakpoint in the simulation, the array processor 440 will look at the instruction memory bits 810 to determine the type of array and at the array disable register 850 to determine if the current array is to be updated for a breakpoint. If the array disable register 850 indicates the corresponding array is not to be updated for the current breakpoint cycle then the array processor will not update the corresponding array.

According to the preferred embodiments, a simulator system with a hardware accelerator has been described that has hardware support for a combinational only cycle and a latch only cycle in a simulation model with a single partition of latches and combinational logic. This system allows for simulation and emulation to take place at greater speeds and with increased flexibility than prior art systems.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention.

What is claimed is:

1. A hardware simulation system comprising:
   a hardware accelerator;
   a simulation model in the hardware accelerator;
   a single partition of latches logic and combinational logic in the simulation model, wherein the latches logic comprises latch memory elements and the combinational logic comprises combinational logic memory elements, wherein the combinational logic memory elements comprise transparent latches and write before read arrays;
   hardware to support a combinational logic only cycle of the simulation model, where the combinational only cycle prevents updates to the latch memory elements while running a simulation that processes both the latches and the combinational logic, wherein in the hardware to support the combinational logic only cycle comprises an array of function units with a special function selection circuit comprising a multiplexer that allows the latches to retain the pervious value for the combinational logic only cycle by selecting a special function and providing the special function to the function unit; and
   hardware to support a latch only cycle, where the latch only cycle prevents updates to the combinational logic memory elements while running the simulation that processes both latches and combinational logic.

2. The hardware simulation system of claim 1 wherein the multiplexer selects the special function from a special function register and provides the special function to the function unit and the special function is a value that sets the function unit to retain the same value as the previous cycle by selecting the value of the previous cycle on an input selected by the special function.

3. The hardware simulation system of claim 1 further comprising:
   a latch disable register with a bit to indicate which type of latches are to be updated for a current cycle of the hardware accelerator.

4. The hardware simulation system of claim 3 wherein the latch disable register includes bits to indicate disable latches and transparent latches, and disable latches and transparent latches on a breakpoint.

5. The hardware simulation system of claim 1 wherein the simulation model further comprises a bit for each write port to indicate what type of array is associated with the write port.

6. A hardware simulation system comprising:
   a host computer with a hardware simulator;
   a hardware accelerator that communicates with the hardware simulator in the host computer;
   a simulation model in the hardware accelerator;
   a single partition of latches logic and combinational logic in the simulation model, wherein the latches logic comprises latch memory elements and the combinational logic comprises combinational logic memory elements, and wherein the combinational logic memory elements comprise transparent latches and write before read arrays;
   hardware to support a latch only cycle, where the latch only cycle prevents updates to the latch memory elements while running a simulation that processes both the latches and the combinational logic, and
   hardware to support a combinational logic only cycle, where the combinational only cycle prevents updates to the combinational logic memory elements while running the simulation that processes both latches and combinational logic wherein in the hardware to support the combinational logic only cycle comprises an array of function units with a special function selection circuit comprising a multiplexer that allows the latches to retain the pervious value for the combinational logic only cycle by selecting a special function and providing the special function to the function unit.

7. The hardware simulation system of claim 6 wherein the multiplexer selects the special function from a special function register and provides the special function to the function unit and the special function is a value that sets the function unit to retain the same value as the previous cycle by selecting the value of the previous cycle on an input selected by the special function.

8. The hardware simulation system of claim 6 further comprising:
   a latch disable register with a bit to indicate which type of latches are to be updated for a current cycle of the hardware accelerator.

9. The hardware simulation system of claim 8 wherein the latch disable register includes bits to indicate disable latches and transparent latches, and disable latches and transparent latches on a breakpoint.

10. The hardware simulation system of claim 6 wherein the simulation model further comprises a bit for each write port to indicate what type of array is associated with the write port.

* * * * *